US010719640B2

(12) United States Patent
Matsumoto

(10) Patent No.: US 10,719,640 B2
(45) Date of Patent: Jul. 21, 2020

(54) DATA ANALYSIS APPARATUS AND DATA ANALYSIS METHOD

(71) Applicant: HITACHI SOLUTIONS, LTD., Tokyo (JP)

(72) Inventor: Toshiko Matsumoto, Tokyo (JP)

(73) Assignee: HITACHI SOLUTIONS, LTD., Tokyo (JP)

(*) Notice: Subject to any disclaimer, the term of this patent is extended or adjusted under 35 U.S.C. 154(b) by 358 days.

(21) Appl. No.: 15/665,559

(22) Filed: Aug. 1, 2017

(65) Prior Publication Data

US 2018/0060464 A1    Mar. 1, 2018

(30) Foreign Application Priority Data

Aug. 31, 2016  (JP) .................................. 2016-170247

(51) Int. Cl.
*G06Q 10/06* (2012.01)
*G06F 30/20* (2020.01)
(Continued)

(52) U.S. Cl.
CPC .......... *G06F 30/20* (2020.01); *G06Q 10/063* (2013.01); *G01R 31/318357* (2013.01);
(Continued)

(58) Field of Classification Search
None
See application file for complete search history.

(56) References Cited

U.S. PATENT DOCUMENTS 5,987,243 A * 11/1999 Aihara .................... G06F 30/33
703/17
7,058,587 B1 * 6/2006 Horne .................... G06Q 10/06
705/7.22
(Continued)

FOREIGN PATENT DOCUMENTS

JP    2012-168873 A    9/2012
JP    2015-176189 A    10/2015

OTHER PUBLICATIONS

Extended European Search Report in counterpart EP Application No. 17184279.2 dated Oct. 11, 2017.
(Continued)

*Primary Examiner* — Kibrom K Gebresilassie
(74) *Attorney, Agent, or Firm* — Volpe and Koenig, P.C.

(57) ABSTRACT

There is provided a data analysis apparatus, comprising an event occurrence setting module configured to cause a prescribed event to occur in a simulation for a work order that includes a process at which the prescribed event is to occur an event occurrence detection timing setting module configured to store an event occurrence detection timing indicating a time period between an occurrence of an event and detection of the event, a simulation executing processing module configured to execute a simulation when an occurrence of the event is detected, the simulation executing processing module being configured to execute a simulation that reflects an effect on the process when the event is addressed in accordance with the event occurrence detection timing recorded in the storage module, and a KPI calculating module configured to calculate a KPI of the process for the event occurrence detection timing, based on results of the simulation.

8 Claims, 12 Drawing Sheets

1400 — EVENT DEFINITION:
INCREASE IN PROCESS WORK TIME: PROBABILITY 0.01
DELAY IN PROCESS START TIME: PROBABILITY 0.02
DELAY IN ORDER START: PROBABILITY 0.005
RESTART ORDER FROM THE MIDDLE: PROBABILITY 0.001
RESTART ORDER FROM THE BEGINNING: PROBABILITY 0.01

EFFECT OF RESCHEDULING TIMING

| EVALUATION VALUE | 5 HOURS AFTER EVENT OCCURRENCE | IMMEDIATELY AFTER EVENT OCCURRENCE |
|---|---|---|
| LEAD TIME | 10 | 9 |
| INVENTORY | 15 | 14 |
| ON-TIME DELIVERY RATE | 92% | 95% |

(51) Int. Cl.
*H04L 12/26* (2006.01)
*G06F 30/3312* (2020.01)
*G01R 31/3183* (2006.01)

(52) U.S. Cl.
CPC ..... *G06F 30/3312* (2020.01); *G06Q 10/0631* (2013.01); *H04L 43/0852* (2013.01)

(56) References Cited

U.S. PATENT DOCUMENTS

| | | | | |
|---|---|---|---|---|
| 7,310,607 | B2* | 12/2007 | Brandt | G06Q 10/06 705/2 |
| 7,353,477 | B2* | 4/2008 | Hathaway | H04L 41/14 716/113 |
| 8,527,388 | B1* | 9/2013 | Schoen | G06Q 40/04 705/35 |
| 10,410,178 | B2* | 9/2019 | Leary | G06Q 10/063116 |
| 2001/0051037 | A1* | 12/2001 | Safadi | H04N 5/4401 386/292 |
| 2002/0194048 | A1* | 12/2002 | Levinson | G06Q 10/06311 705/7.26 |
| 2005/0216894 | A1* | 9/2005 | Igarashi | G06F 11/3457 717/126 |
| 2005/0256600 | A1* | 11/2005 | Nakasugi | B82Y 40/00 700/100 |
| 2006/0149526 | A1* | 7/2006 | Torossian | G06F 30/33 703/16 |
| 2007/0156613 | A1* | 7/2007 | Safoutin | G07C 3/06 705/411 |
| 2007/0168067 | A1* | 7/2007 | Yaji | G05B 19/41865 700/100 |
| 2010/0161789 | A1* | 6/2010 | Walia | G06F 11/3414 709/224 |
| 2011/0225595 | A1* | 9/2011 | Chujo | G05B 19/0426 718/106 |
| 2013/0190913 | A1* | 7/2013 | Lamparter | G06Q 10/08 700/99 |
| 2013/0325765 | A1* | 12/2013 | Hunzinger | G06N 3/02 706/15 |
| 2017/0011326 | A1* | 1/2017 | Liao | G06Q 10/063114 |
| 2017/0316365 | A1* | 11/2017 | Karasudani | G06Q 50/22 |
| 2018/0268507 | A1* | 9/2018 | Johnson | G06Q 50/22 |

OTHER PUBLICATIONS

Japanese Office Action dated Nov. 19, 2019 for the Japanese Patent Application No. 2016-170247.

* cited by examiner

021

EVENT PARAMETER

| MEMBER NAME | VALUE |
|---|---|
| TYPE | INCREASE IN PROCESS WORK TIME |
| OCCURRENCE PROBABILITY | 0.01 |
| LEVEL OF IMPACT | 200% |

201 — TYPE
202 — OCCURRENCE PROBABILITY
203 — LEVEL OF IMPACT

EVENT DATA

| MEMBER NAME | VALUE |
|---|---|
| TYPE | INCREASE IN PROCESS WORK TIME |
| ORDER | 10 |
| PROCESS SEQUENCE | 2 |
| LEVEL OF IMPACT | 2 |

301 — TYPE
302 — ORDER
303 — PROCESS SEQUENCE
304 — LEVEL OF IMPACT

FIG. 3

030
REPLACEABLE EQUIPMENT DATA

| MEMBER NAME | VALUE |
|---|---|
| EQUIPMENT | {EQUIPMENT-02, EQUIPMENT-05,...} |

401 — EQUIPMENT row

FIG. 4

023
SCHEDULE DATA

| MEMBER NAME | VALUE |
|---|---|
| ORDER | 2 |
| PROCESS SEQUENCE | 10 |
| PLANNED START TIME | 12 |
| PLANNED EQUIPMENT ID | EQUIPMENT-02 |

501 — ORDER
502 — PROCESS SEQUENCE
503 — PLANNED START TIME
504 — PLANNED EQUIPMENT ID

FIG. 5

024
PROCESS DEFINITION DATA

| MEMBER NAME | VALUE |
|---|---|
| ORDER | 2 |
| PROCESS SEQUENCE | 10 |
| WORK TIME | 1.5 |
| EARLIEST START TIME | 10 |
| AVAILABLE EQUIPMENT | {EQUIPMENT-02, EQUIPMENT-05} |

601 — ORDER
602 — PROCESS SEQUENCE
603 — WORK TIME
604 — EARLIEST START TIME
605 — AVAILABLE EQUIPMENT

FIG. 6

029
PROMPT TARGET DATA

| MEMBER NAME | VALUE |
|---|---|
| ORDER CONDITION | 1, 2, 9, 10 |
| EQUIPMENT CONDITION | {EQUIPMENT-01, EQUIPMENT-02, EQUIPMENT-04} |
| TIME CONDITION | 16:00-17:30 |

701 — ORDER CONDITION
702 — EQUIPMENT CONDITION
703 — TIME CONDITION

*FIG. 7*

025
PRODUCTION RESULT DATA

| MEMBER NAME | VALUE |
|---|---|
| ORDER | 2 |
| PROCESS SEQUENCE | 10 |
| STANDARD TIME | 1.5 |
| EQUIPMENT ID | EQUIPMENT-10 |
| START TIME | 10 |
| COMPLETION TIME | 11.5 |

801 — ORDER
802 — PROCESS SEQUENCE
803 — STANDARD TIME
804 — EQUIPMENT ID
805 — START TIME
806 — COMPLETION TIME

EVENT DEFINITION:
  INCREASE IN PROCESS WORK TIME: PROBABILITY 0.01
  DELAY IN PROCESS START TIME: PROBABILITY 0.02
  DELAY IN ORDER START: PROBABILITY 0.005
  RESTART ORDER FROM THE MIDDLE: PROBABILITY 0.001
  RESTART ORDER FROM THE BEGINNING: PROBABILITY 0.01

EFFECT OF RESCHEDULING TIMING

| EVALUATION VALUE | 5 HOURS AFTER EVENT OCCURRENCE | IMMEDIATELY AFTER EVENT OCCURRENCE |
|---|---|---|
| LEAD TIME | 10 | 9 |
| INVENTORY | 15 | 14 |
| ON-TIME DELIVERY RATE | 92% | 95% |

*FIG. 14*

DATA ANALYSIS APPARATUS AND DATA ANALYSIS METHOD

CLAIM OF PRIORITY

The present application claims priority from Japanese patent application JP 2016-170247 filed on Aug. 31, 2016, the content of which is hereby incorporated by reference into this application.

BACKGROUND

The present invention relates to a technology for conducting a simulation on each process to estimate the effect of appropriately handling an event when the occurrence thereof is detected.

In manufacturing, more and more customers are requiring a shorter lead time for product delivery. A shorter lead time is also desirable from the perspectives of reducing a storage space for work-in-process and improving cash flow. Against this background, as described in Japanese Patent Application Laid-open Publication No. 2015-176189 (Patent Document 1), various companies are making an attempt to produce products utilizing the technology for making an optimized production schedule based on the processes and sequences regarding the orders from customers, equipment and work time (work standard time) required for each process, and the like.

SUMMARY OF THE INVENTION

FIG. 15 is a diagram showing an example in which each process is conducted in accordance with the created schedule. In this example, a plurality of processes are conducted respectively for two orders. Specifically, as shown with the solid line, the processes for the first order are conducted from 9:00 to 9:30 using equipment 1, from 10:00 to 10:30 using equipment 3, and from 11:00 to 12:00 using equipment 4. Also, the processes for the second order are conducted from 9:00 to 10:00 using equipment 2, from 11:00 to 12:00 using equipment 3, and from 12:30 to 14:00 using equipment 4.

In a factory that manufactures a number of different types of products, products with customized requirements, or products based on a specific design, the production does not always proceed according to a schedule. Due to various events such as unexpected extension of process time, minor defects of production machines, investigation on the location of work-in-process, delay in arrival of purchased parts, need to discard the entire lot of products, and receipt of urgent order, a discrepancy between the initial schedule and the actual production always occurs at a certain probability.

FIG. 16 is a diagram showing a case in which the process time is unexpectedly prolonged. In this example, the work time of the second process using equipment 3 for the first order is extended from 0.5 to 1. Because a plurality of processes cannot be conducted in the same equipment at the same time, the schedule of the process using the equipment 3 for the second order subsequent to the process using the equipment 3 for the first order is affected by this change.

FIG. 17 is a diagram showing an example in which a fault of the production machine or an investigation on the location of work-in-process took place. In this example, a time between the second process and the third process for the first order is made longer. This causes a delay in the start time and end time of the third process using equipment 4 for the first order, and as a result, in a manner similar to FIG. 16, the schedule of the process using the equipment 4 for the second order is affected.

FIG. 18 is a diagram showing an example in which the shipment of purchased parts is delayed. In this example, the start time of the first process using equipment 1 for the first order is delayed from 9 to 9.5. As a result, the end time of each of the second and third processes for the first order is delayed although the duration does not change, and the schedule of the processes using the equipment 3 and equipment 4 for the second order is affected by this in a manner similar to FIGS. 16 and 17.

FIG. 19 is a diagram showing an example of discarding the entire lot of products. The first order stopped in the second process, and started over from the first process. As a result, the end time of each of the second and third processes for the first order is delayed, and the schedule of the processes using the equipment 3 and equipment 4 for the second order is affected by this in a manner similar to FIGS. 16, 17 and 18.

FIG. 20 is a diagram showing an example of receiving an urgent order. In this example, the production for the first order is conducted twice. As a result, the end time of each of the second and third processes for the first order is delayed, and the schedule of the processes using the equipment 3 and equipment 4 for the second order is affected by this in a manner similar to FIGS. 16, 17, 18 and 19.

In some cases, those events are not detected by a schedule management system in real-time due to the fact that the production results are written in a sheet of paper instead of being digitalized or the production results are managed by a plurality of systems. This delay in detecting an event further delays the timing of rescheduling, and even the delay in production gets worse unnecessarily even in a case where the delay would be resolved if the rescheduling was performed immediately after the event occurs and the production efficiency was increased accordingly.

However, whether or not the delay worsened because of a delay in rescheduling, which caused by a delay in detecting an event, can only be determined by estimating the production time at a point in time when the event is detected. Thus, if the production end time in the case where the rescheduling was performed upon detection of the event cannot be estimated accurately and quantitatively, the effect of the event cannot be evaluated, and thus, it is not possible to evaluate the effect of the rescheduling at an appropriate timing to suppress the adverse effect of the delay. Furthermore, it is not possible to evaluate the effect of the system to collect production results in real-time.

In order to solve the foregoing problems, there is provided a data analysis apparatus, comprising: an event occurrence setting module configured to cause a prescribed event to occur in a simulation for a work order that includes a process at which the prescribed event is to occur; an event occurrence detection timing setting module configured to store, in a storage module, an event occurrence detection timing indicating a time period between an occurrence of an event and detection of the event; a simulation executing processing module configured to execute a simulation when an occurrence of the event is detected, the simulation executing processing module being configured to execute a simulation that reflects an effect on the process when the event is addressed in accordance with the event occurrence detection timing recorded in the storage module; and a KPI calculating module configured to calculate a KPI of the process for the event occurrence detection timing, based on results of the simulation executed by the simulation executing processing module.

According to an embodiment of the present invention, by conducting a simulation, the effect of deploying the system to collect production results can be estimated quantitatively. The problems, configurations, and effects other than those described above will become apparent by the descriptions of embodiments below.

BRIEF DESCRIPTIONS OF THE DRAWINGS

FIG. 2 is a diagram showing the configuration of an event parameter and an example of the data stored therein in an embodiment of the present invention.

FIG. 3 is a diagram showing the configuration of an event data and an example of the data stored therein of an embodiment of the present invention.

FIG. 4 is a diagram showing the configuration of replaceable equipment data and an example of the data stored therein in an embodiment of the present invention.

FIG. 5 is a diagram showing the configuration of schedule data and an example of the data stored therein in an embodiment of the present invention.

FIG. 6 is a diagram showing the configuration of process definition data and an example of the data stored therein of an embodiment of the present invention.

FIG. 7 is a diagram showing the configuration of prompt target data and an example of the data stored therein in an embodiment of the present invention.

FIG. 8 is a diagram showing the configuration of production result data and an example of the data stored therein in an embodiment of the present invention.

FIG. 14 is a diagram explaining information output by the data analysis apparatus of an embodiment of the present invention.

EMBODIMENTS OF THE INVENTION

Figure 1:
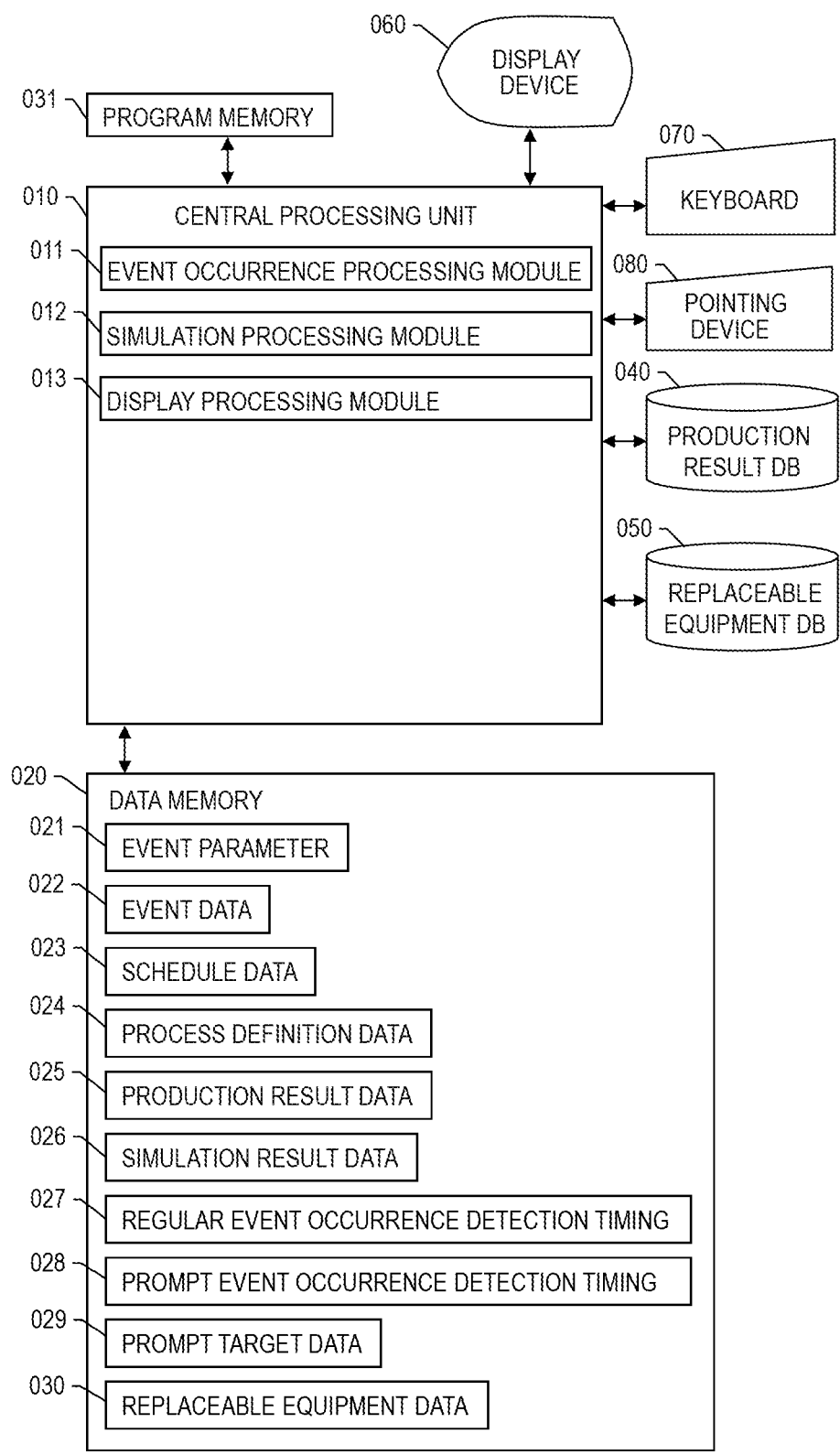
FIG. 1 is a block diagram showing the configuration of a data analysis apparatus of an embodiment of the present invention.

Below, embodiments of a data analysis apparatus of the present invention will be explained with reference to appended figures. Embodiments described below and the descriptions thereof are merely examples, and various modifications are possible for the present invention.

<System Configuration>

FIGS. 1 to 20 are drawings for showing examples of the embodiment described below, and in those figures, the same reference characters represent the same objects or components, which have basically the same configuration and operation as each other.

FIG. 1 is a block diagram showing the configuration of a data analysis apparatus of an embodiment of the present invention.

The data analysis apparatus is an apparatus to estimate the effects, such as a lead time, of the rescheduling for the processes that are unfinished upon detection of an event and conducting those processes according to the revised schedule. The data analysis apparatus includes a central processing unit 010, a data memory 020, a program memory 031, a production result DB (database) 040, a replaceable equipment DB 050, a display device 060, a keyboard 070, and a pointing device 080. The central processing unit 010 is connected to the data memory 020, the program memory 031, the production result DB (database) 040, the replaceable equipment DB 050, the display device 060, the keyboard 070, and the pointing device 080, respectively.

The central processing unit 010 includes an event occurrence processing module 011, a simulation processing module 012, and a display processing module 013. The event occurrence processing module 011 determines an order or a process in an order where an event affecting the status of the process, such as an increase in processing time, takes place. The simulation processing module 012 is configured to estimate a process completion time for a case in which the schedule for the unfinished processes is revised every time when a schedule management system detects an occurrence of an event, and those processes are conducted under the new schedule. Examples of the schedule management system include a system that actually manages the schedule in a plant and the like for which the data analysis apparatus of the present invention conduct simulation. The display processing module 013 calculates and displays the lead time, on-time deliver rate, and the like when the schedule is revised every time when an event takes place and each process is conducted and completed under the new schedule.

The data memory 020 stores therein various types of parameters and data used to cause an event to occur, perform a simulation, and display the results thereof by the respective processing modules of the central processing unit 010. The data memory 020 stores therein event parameter 021, event data 022, schedule data 023, process definition data 024, production result data 025, simulation result data 026, regular event occurrence detection timing 027, prompt event occurrence detection timing 028, prompt target data 029, and replaceable equipment data 030.

The functions of the event occurrence processing module 011, the simulation processing module 012, and the display processing module 013 are realized by the central processing unit 010 executing programs (not shown in the figure) stored in the program memory 031. Thus, the processes conducted by the respective processing modules in the descriptions below are actually conducted by the central processing unit 010 according to the commands written in the programs. The program memory 031 and the data memory 020 may be the same storage device. The production result DB 040 and the replaceable equipment DB 050 may each be a storage device such as a hard disk drive, for example, or may be the same storage device. At least a part of the data included in the production result DB 040 and the replaceable equipment DB 050 may be copied in the data memory 020 as necessary.

FIG. 2 is a diagram showing the configuration of the event parameter 021 and an example of the data stored therein in an embodiment of the present invention.

The event parameter 021 is a data table that defines the probability of each type of events used in a simulation and the level of impact of each type of events.

The event parameter 021 has type 201, occurrence probability 202, and level of impact 203 as the data fields.

The type 201 is a field showing a type of event that could occur and has "increase in process work time," "delay in process start time," "delay in order start time," "restart an order from the middle," or "restart the order from the beginning" as a value thereof.

The occurrence probability 202 is a field that defines the probability of corresponding events for a particular order. In each order, a process in which an event would occur is randomly determined.

The level of impact 203 is a field showing the level of impact of the event on the process and other processes of the same order, and is defined for each type of the events. If the event type 201 is "increase in process work time," the level of impact 203 defines how much longer the process work time would be due to the event occurrence as compared to the case in which the event does not occur. If the event type 201 is "delay in process start time," the level of impact 203 defines how much longer the time window between the completion of the preceding process and the start of the subject process would be due to the event occurrence as compared to the case in which the event does not occur. If the event type 201 is "delay in order start time," the level of impact 203 defines how many hours or how many days the start of the first process of the order would delay due to the event occurrence. If the event type 201 is "restart an order from the middle" and "restart an order from the beginning," there is no impact on other processes of the order, and the level of impact is not defined. The level of impact is used when the process definition data is updated in S1106 of the simulation process flow. The number of elements in the event parameter in this embodiment is 5.

Figure 19:
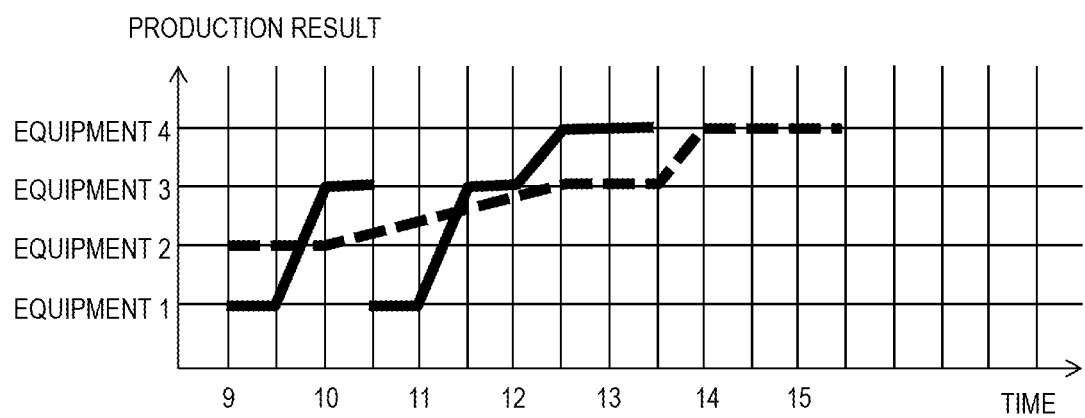
FIG. 19 is a diagram showing an example of discarding the entire lot of products.
Figure 20:
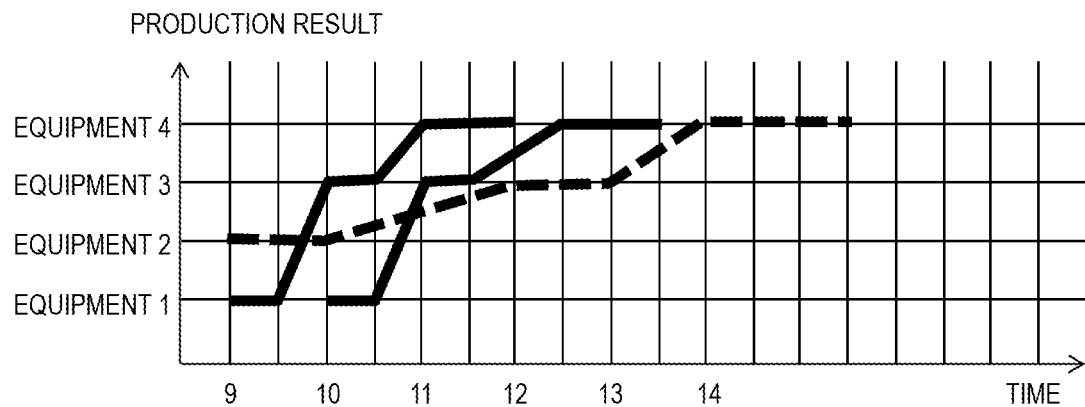
FIG. 20 is a diagram showing an example of receiving an urgent order.

The "increase in process work time," "delay in process start time," "delay in order start time," "restart the order from the middle," and "restart the order from the beginning" correspond the respective examples shown in FIGS. 16 to 20. As shown in FIG. 19, "restart the order from the middle" is an event where the work for an order for which all of the processes are not completed is canceled, and the work is restarted from the first process. "Restart the order from the beginning" is an event where an order for which all of the processes have been completed is restarted from the first process.

FIG. 3 is a diagram showing the configuration of the event data 022 and an example of the data stored therein of an embodiment of the present invention.

The event data 022 is a data table showing a type of the event to be used for the target of a simulation, and impact of the event on other processes.

The event data 022 has type 301, order 302, process sequence 303, and level of impact 304 as the data fields.

The type 301 shows the type of the event to be used for the target of a simulation. The order 302 shows an order corresponding to the process at which an event occurs in the simulation. The process sequence 303 shows the ordinal number of the corresponding process in the order. The level of impact 304 shows the level of impact of the event on other processes of the same order.

The simulation processing module 012 determines whether the occurrence probability 202 of the read-out event parameter 021 is greater than a variable randomly generated by the system or not for each process of each order obtained from the production result data 025. If the occurrence probability 202 is greater than the variable generated randomly, the simulation processing module 012 presumes that the read-out event occurs, and generates the event data 022. The element number of the event data 022 is the number of events predicated to occur in the simulation.

The simulation processing module 012 performs a simulation based on the generated event data 022. The simulation based on the event data 022 will be described in detail below.

FIG. 4 is a diagram showing the configuration of the replaceable equipment data 030 and an example of the data stored therein in an embodiment of the present invention.

The replaceable equipment data 030 is a data table that stores therein data showing equipment that can be used as a replacement for faulted equipment or the like in a particular process. The replaceable equipment data 030 includes equipment 401 as the data field.

This data is referred to by the scheduler to create the most appropriate new schedule by avoiding a delay in process due to the unavailability of equipment.

The example of FIG. 4 shows that the equipment 02 and the equipment 05 can be replaced with each other, or in other words, the same process can be conducted using either one of them.

FIG. 5 is a diagram showing the configuration of the schedule data 023 and an example of the data stored therein in an embodiment of the present invention.

The schedule data 023 is a table used to determine the start time and equipment to be used for each process whether or not an event occurs in the process in the simulation.

The schedule data 023 includes order 501, process sequence 502, planned start time 503, and planned equipment ID 504 as the data fields.

The order 501 shows an order corresponding to the process for which the simulation is performed. The process sequence 502 shows the ordinal number of the corresponding process in the order. The planned start time 503 shows the time at which the process is started in the simulation. The planned equipment ID 504 shows the equipment at which the process is conducted in the simulation.

If "delay in the process start time" or "delay in order start" occurs in a particular process, the planned start time 503 of the schedule data 023 is updated. Also, the planned start time 503 and the planned equipment ID 504 may be updated by the scheduler in order to create a more efficient new schedule in Step S1111 of the simulation process flow, taking into account the relationship with the respective processes or other orders.

FIG. 6 is a diagram showing the configuration of the process definition data 024 and an example of the data stored therein of an embodiment of the present invention.

The process definition data 024 is a table used to calculate the completion time of each process, or calculate the most appropriate schedule in the simulation process.

The process definition data 024 includes order 601, process sequence 602, work time 603, earliest start time 604, and available equipment 605 as the data fields.

The order 601 shows an order corresponding to the process for which the simulation is performed. The process sequence 602 shows the ordinal number of the corresponding process in the order. The work time 603 shows a period of time required to complete the process. The earliest start time 604 shows the earliest time of the day at which the process can be started based on the arrival time of the materials or the like. The available equipment 605 shows equipment available to conduct the process. If a plurality of pieces of equipment are included in the available equipment 605, those pieces of equipment can be replaced with each other.

The process definition data 024 is generated for each of the production result data based on the production result data 025 whether an event occurs in the process or not. The number of the process definition data 024 to be generated is the same as the number of elements.

FIG. 7 is a diagram showing the configuration of the prompt target data 029 and an example of the data stored therein in an embodiment of the present invention.

The prompt target data 029 shows the conditions to detect an event immediately after the occurrence thereof by the deployment of the system to collect the production results. In some cases, it is difficult to deploy the result-collecting system in all of the processes that makes it possible to detect an event by the schedule management system immediately after the event occurs. Thus, the result-collecting system is sometimes deployed only in selected processes or equipment that significantly affect the subsequent processes. In this case, the schedule management system detects an occurrence of event immediately after the event occurs in those processes only. The prompt target data 029 shows the condition to identify the target of such prompt detection of the occurrence of an event.

The prompt target data 029 includes order condition 701, equipment condition 702, and time condition 703 as the data fields.

The order condition 701 shows an order to be subjected to the prompt detection. The equipment condition 702 lists up equipment to be subjected to the prompt detection. The time condition 703 shows a time window to detect an event immediately.

FIG. 8 is a diagram showing the configuration of the production result data 025 and an example of the data stored therein in an embodiment of the present invention.

The production result data 025 is a table that includes the start time and work time collected from the manufacturing site by the POP (point of production) system for each process of each order.

The production result data 025 includes order 801, process sequence 802, standard time 803, equipment ID 804, start time 805, and completion time 806 as the data fields.

The order 801 shows an order corresponding to the process conducted. The process sequence 802 shows the ordinal number of the corresponding process in the order. The standard time 803 shows a standard period of time required to complete the process. The equipment ID 804 shows equipment at which the process was actually conducted. The start time 805 shows the time at which the process was actually started. The completion time 806 shows the time at which the process was actually completed.

The production result data 025 is used to initially create the schedule data 023 and the process definition data 024 for each process used for the simulation.

<System Operation>

Figure 9:
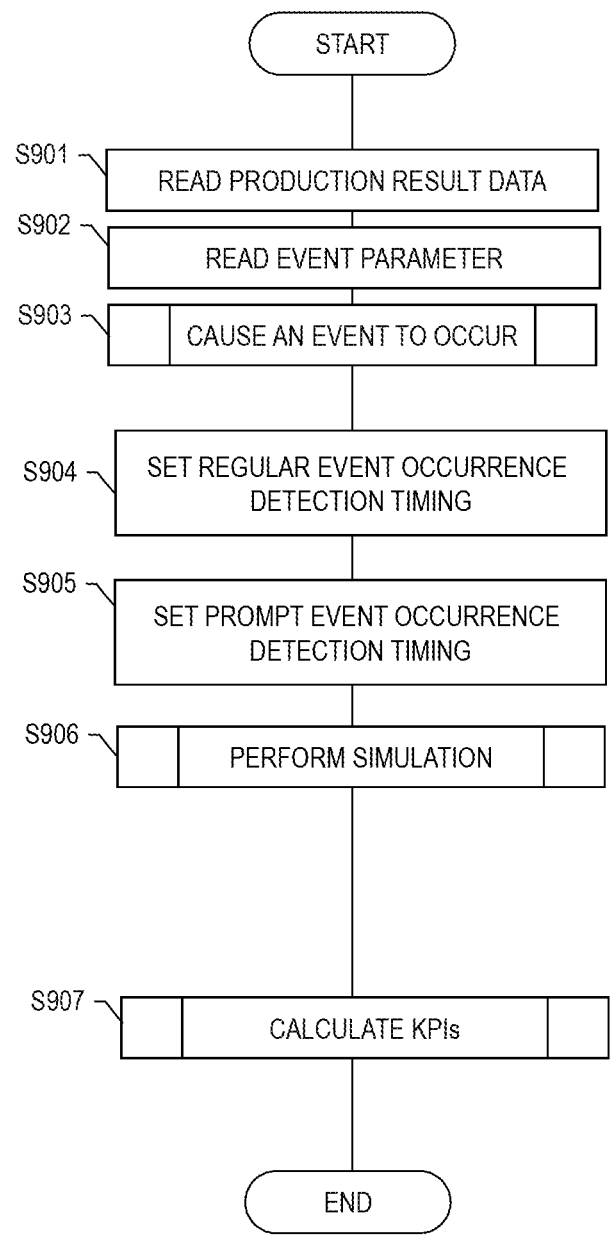
FIG. 9 is a flowchart showing a process overview of the data analysis apparatus of an embodiment of the present invention.

FIG. 9 is a flowchart showing the process overview of the data analysis apparatus of an embodiment of the present invention.

The process of the data analysis apparatus of this embodiment is configured to calculate KPI (key performance indicator) when each process is conducted and completed after the schedule management system takes an appropriate measure such as making a new schedule for unfinished processes when the schedule management system detects the occurrence of an event that affects the process status, such as an increase in process work time, taking into consideration the fact that some events are not detected immediately by the schedule management system.

The flowchart showing the process overview of the data analysis apparatus will be explained.

First, the production result data 025 is read out (S901). Then, in order to conduct a simulation process for all of the processes having the production results, the event occurrence processing module 011 reads out all the data stored in the production result data 025.

Next, the event occurrence processing module 011 reads out all of five parameters from the event parameter 021 (S902).

Next, the event occurrence processing module 011 determines whether an event such as an increase in process work time or a delay in start time occurs or not for each process of each order obtained from the read-out production result data 025 in the simulation (S903). This process will be described in detail below with reference to FIG. 10.

Next, the simulation processing module 012 sets the regular event occurrence detection timing that indicates a period of time between the occurrence of the determined event and the detection of the event by the schedule management system (S904).

Next, the simulation processing module 012 sets the prompt event occurrence detection timing that indicates a period of time between the occurrence of an event and the detection of the event when the result-collecting system is deployed (S905). For example, in some cases, a result-collecting system is deployed for new equipment only in order to reduce the investment for the deployment of the result collecting system while minimizing the effect of the occurrence of events. In the process where the result-collecting system is deployed, the schedule management system can detect the occurrence of an event quickly and perform the rescheduling, but when an event occurs in other processes, the event will not be detected immediately, and the rescheduling is performed when the event is detected several hours later, for example. By setting the prompt event occurrence detection timing, it is possible to estimate the effect of partially deploying the result-collecting system. Thus, the prompt event occurrence detection timing is set such that a period of time between the event occurrence and the event detection is shorter than that of the regular event occurrence detection timing.

Next, the simulation processing module 012 conducts a simulation process (S906). The simulation process is conducted at timings where the schedule management system detects an occurrence of an event and performs rescheduling based on the detection timings. If the process is affected by the occurrence of the event, the simulation takes into consideration a delay in the process work time by the occurrence of the event and the like. If the process is not affected by the occurrence of the event, the simulation is conducted based on the process start time and work time of the original schedule. After the time at which an event is detected and the rescheduling is performed, the schedule of the processes not finished at that point is revised appropriately (rescheduling described below), and the schedule data 023 is set. Then based on the schedule data 023, a simulation is conducted from the start to the end of each process. This process will be described in detail below with reference to FIGS. 11 to 13.

The simulation processing module 012 may conduct the simulation process of S906 by setting different regular event occurrence detection timing and prompt event occurrence detection timing.

Next, the display processing module 013 calculates the lead time and KPIs such as the on-time delivery rate for each pattern of the deployment of result-collecting system (S907). This process will be described in detail below with reference to FIG. 14.

Figure 10:
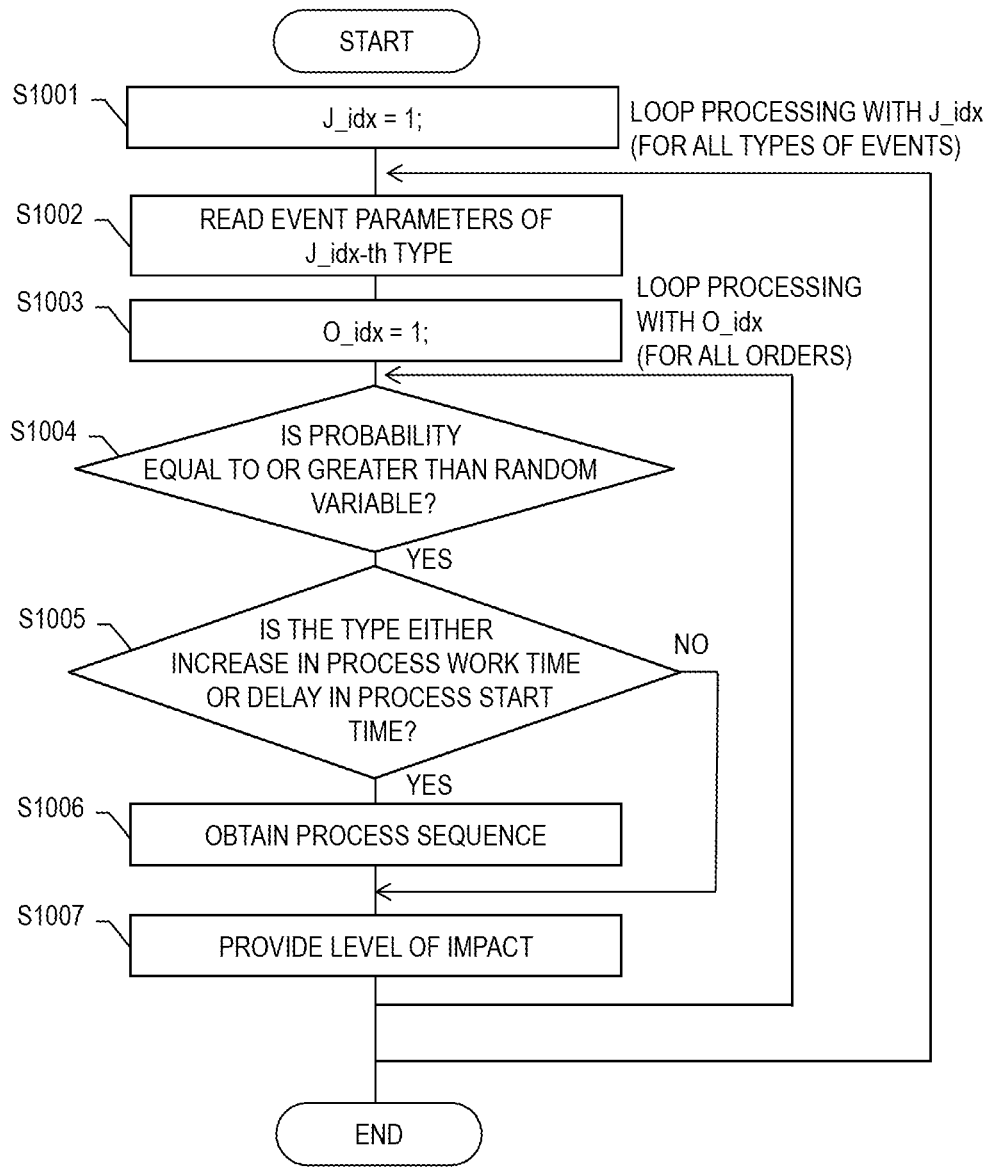
FIG. 10 is a flowchart showing an event occurrence process conducted by the data analysis apparatus of an embodiment of the present invention.

FIG. 10 is a flowchart showing the event occurrence process conducted by the data analysis apparatus of an embodiment of the present invention.

The event occurrence process is to determine whether an event such as an increase in process work time or a delay in start time is going to occur or not for each order or each process of each order conducted in the simulation. For the order or the process in an order for which an event is predicted to occur, the event data 022 is generated. The event data 022 indicates the level of impact 304 for the type of event 301, order 302, and the process sequence 303 of the order.

Each process in the flowchart of the event occurrence process will be explained.

First, the event occurrence processing module 011 refers to the event parameter 021, and reads out the type 201, the occurrence probability 202, and the level of impact 203 for a certain type of event parameter (S1001, S1002).

Next, the event occurrence processing module 011 sets an order to be processed (S1003). For example, the value "1" indicating the first order is set as the initial value.

Next, the event occurrence processing module 011 determines whether the event probability 202 of the event parameter 021 obtained in S1001 and S1002 is equal to or greater than a variable of at least 0 and less than 1 that was generated randomly by a random number generation algorithm such as Mersenne twister, for example (S1004). This process is to determine whether a particular event is likely to occur for each order in the simulation based on the event probability 202 obtained in S1001 and S1002. That is, the obtained event probability 202 is compared with a random number of at least 0 and less than 1, which was generated randomly, and if the probability 202 is greater, it is determined that the event will occur in the simulation. Through this process, the event occurrence processing module 011 generates event data for the order or a process of the order in which an event is predicted to occur, and the simulation processing module 012 conducts a simulation using this event data. With this event occurrence process, an occurrence of an event can be predicted in a realistic situation.

Next, if it was determined that an event will occur in S1004, the event occurrence processing module 011 determines whether or not the type of obtained event parameter is "increase in process work time" or "delay in process start time" (Step S1005). If the type 201 is either "increase in process work time" or "delay in process start time," the event occurrence processing module 011 randomly extracts the process sequence from the production result data 025 for the subject order 801 (S1006). This is to determine the process in the order where the event occurs.

Next, the event occurrence processing module 011 obtains the level of impact from the event parameter 021 for the case in which the event read out in S1002 occurs in the process determined in S1006 (S1007). The level of impact is used to revise, in the simulation process flow described below, the process definition data (such as an event where the work time 603 increases or the earliest start time 604 is delayed) related to the process determined in S1006.

Lastly, the event occurrence processing module 011 registers the type, subject order, subject process, and level of impact of the event that is predicted to occur in the type 301, order 302, process sequence 303, and level of impact 304 of the event data 022 for the order in which an event is predicated to occur in the simulation.

The event occurrence processing module 011 repeats the processes of S1004 to S1007 for one type of event until the upper limit value of the order stored in the production result data 025 is reached, and when the upper limit value of the order is reached, the event occurrence processing module 011 sets another type of event, and conducts processes similar to above. When the above-described process is completed for all combinations of all of the orders and all of five evens, the process of FIG. 10 is ended.

As described above, in this embodiment, a process to cause an event to occur is conducted based on the production result data 205 read out in S901 and the event parameter 021 read out in S902. This is because the production result data 025 is used for the initial value of the schedule data 023 (see S1102 described below). That is, S901 is a process to create the initial value of the schedule data 023 based on the production result data, and S903 is a process to cause an event to occur based on the initial value of the schedule data 023 created as such and the event parameter 021. As described below, it is also possible to generate the initial value of the schedule data 023 without using the production result data 025, and in this case, the initial value of the schedule data 023 may be created or the initial value created in advance may be read out in S901 instead of reading out the production result data 025.

Figure 11:
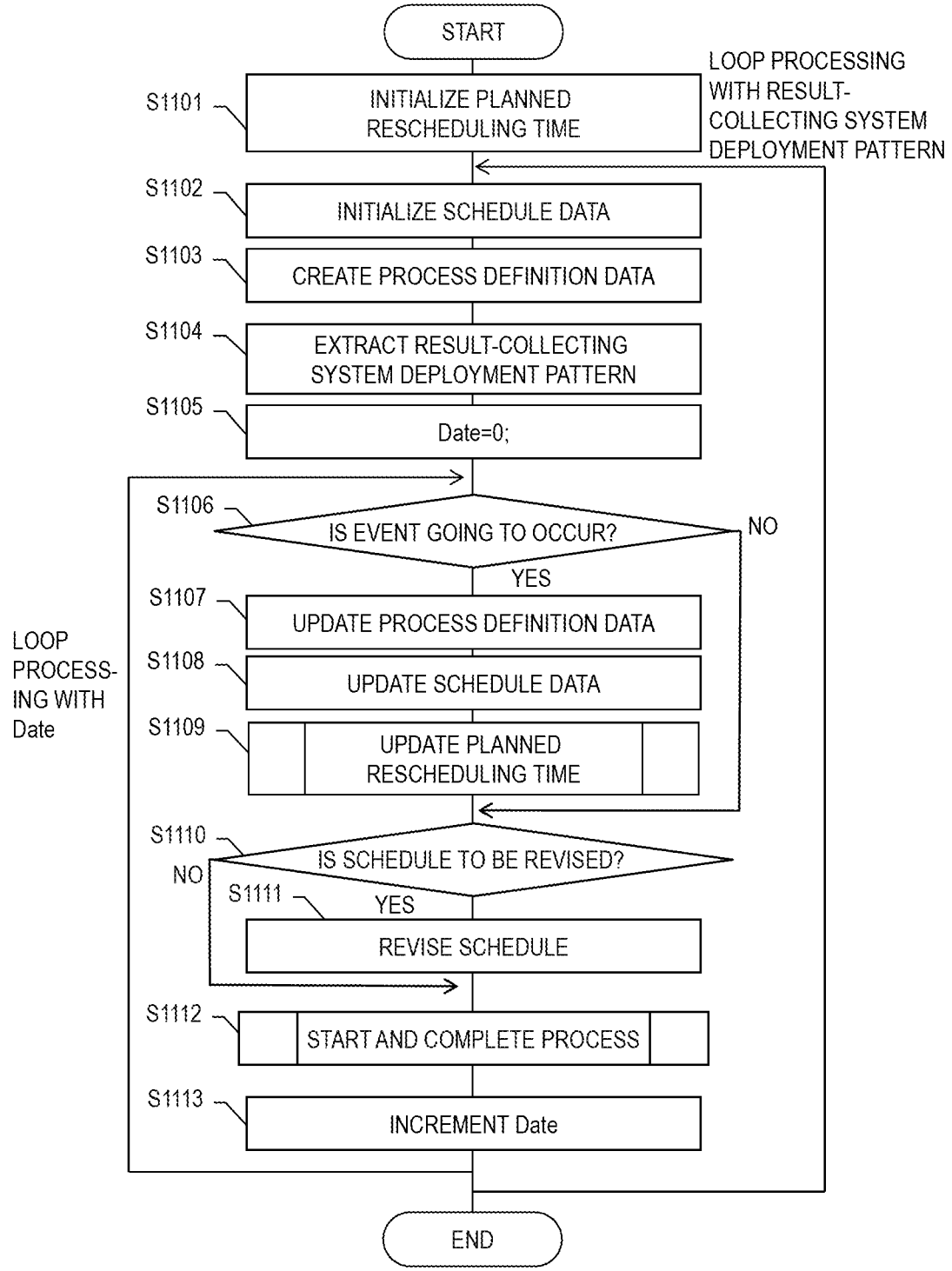
FIG. 11 is a flowchart showing a simulation process conducted by the data analysis apparatus of an embodiment of the present invention.

FIG. 11 is a flowchart showing the simulation process conducted by the data analysis apparatus of an embodiment of the present invention.

In this simulation process, an event such as an increase in process work time is presumed to occur randomly at a prescribed probability in each order or in a process of each order, and the schedule for the processes that are unfinished at a time when the schedule management system detects the occurrence of the event is revised, so that the start time and completion time of each process can be estimated. The simulation is conducted on all of the processes having the production results including the processes before rescheduling.

The flowchart of the simulation process will be explained.

First, the simulation processing module 012 initializes the planned rescheduling time (S1101). The planned rescheduling time shows the time when rescheduling is done after the schedule management system detects the fact that an event has occurred. An infinite future value such as "9999" is set for the initial value thereof.

Next, the simulation processing module 012 initializes the schedule data 023 (S1102). The schedule data 023 is created not only for the process in which an event is predicated to occur, but also all of the data registered as the production result data. The simulation is conducted on each process based on the values of the created schedule data 023. The respective values of the schedule data 023 are also used for rescheduling. The initial values of the schedule data 023 are created by transferring the order 801, process sequence 802, start time 805 and equipment ID 804, which are the data field values of the production result data 025, to the order 501, the process sequence 502, the planned start time 503, and the planned equipment ID 504, which are the data fields of the schedule data 023.

By using the production result data 025 as described above, the initial values of the schedule data 023 that are feasible can be created. However, the method to create the initial values is merely an example, and as described above, it is also possible to create the initial values of the schedule data 023 in other methods than transferring from the production result data 025. In this case, the initial values created in such a manner are read out in S1102. In the example described above, the present invention is applied to manufacturing facility such as a production factory, but the present invention may also be applied to other industries than manufacturing. In such a case, the initial values of the schedule data 023 may be created based on the actual data of work of the industry.

Next, the simulation processing module 012 creates the process definition data 024 (S1103). The process definition data 024 is created not only for the process in which an event is predicted to occur, but also all of the data registered as the production result data. The simulation is conducted based on the respective values of the process definition data 024, along with the schedule data 023. The respective values of the process definition data 024 are also used for optimal rescheduling. The order 801, process sequence 802, and start time 805, which are the field data values of the production result data 025, are transferred to the order 601, process sequence 602, and earliest start time 604, which are the data field of the process definition data 024. In the work time 603, which is a data field value of the process definition data 024, the difference between the completion time 806 and the start time 805, which are the data field values of the production result data 025, is registered. Due to the problem of the standard time being not defined, which was described in the "Problems to be Solved by the Invention" section, the difference between the completion time 806 and the start time 805 is used instead of the standard time of the production result data 025 as it is considered more reliable. In the available equipment 605 of the process definition data 024, the ID of the corresponding equipment 401 is registered referring to the replaceable equipment data 030, based on the value of the equipment ID 804 of the production result data 025.

Next, the simulation processing module 012 extracts the deployment pattern of the result collecting system (S1104). This is for the case in which a system to quickly detect an occurrence of an event (result-collecting system) is deployed partially so that the investment for deploying the result-collecting system can be suppressed, but the impact of the event can be minimized. Examples of the patterns of partially deploying the result-collecting system include a pattern in which a result-collecting system is deployed only for new equipment, a pattern in which only an event that occurs in a process related to work-in-process for a customer with a large account is managed using a tag or the like, and a pattern in which events that occur during a prescribed time window are reported periodically. In order to quantitatively confirm the degree (or area to implement) of the partial deployment for the result-collecting system to be effective, the simulation processing module 012 conducts a simulation process of S1105 to S1113 on each of the plurality of patterns to deploy the result-collecting system. The patterns to deploy the result-collecting system are extracted from the prompt target data 029.

Next, the simulation processing module 012 initializes the variable Date. (S1105). The variable Date corresponds to the current time in the simulation (simulation current time). Date (simulation current time) is used to determine whether the process has been completed at that time or not, whether the time is a process start time or not, and whether it is the time for the schedule management system to detect an event and perform the rescheduling or not. The simulation processing module 012 registers 0 in Date as the initial value. For Date (simulation current time), the simulation processing module 012 conducts the following processes (S1106 to S1113) on the schedule data obtained in S1102; updating the schedule data 023 and process definition data 024 in accordance with the event occurrence, rescheduling, and starting and completing the respective processes. Thereafter, the simulation processing module 012 increments Date (simulation current time) and repeatedly conducts the subsequent processes on all of the remaining data obtained in S1102.

Next, the simulation processing module 012 determines whether the event identified in FIG. 9 occurs at the time indicated by Date (simulation current time) or not for each schedule data 023 (S1106). If Date (simulation current time) has reached the planned start time 503 of the process at which the event is predicted to occur, the simulation processing module 012 determines that the event occurs at that time. That is, the simulation processing module 012 obtains the order 302 and the process sequence 303 of the process at which the event is predicted to occur from the event data 022, and extracts the schedule data 023 having the order 501 and process sequence 502 corresponding to the obtained order 302 and process sequence 303.

If the type 301 of the event that is predicted to occur is "increase in process work time," "delay in process start time," or "delay in order start," and if the planned start time 503 of the extracted schedule data 023 equals to Date (simulation current time), the simulation processing module 012 determines that the predicted event (event that causes a delay in process) occurs at that time. If the type 302 of the predicated event is other than those described above, or in other words, "restart the order in the middle" or "restart the order from the beginning," and if the sum of the planned start time 503 of the schedule data 012 and the work time 603 of the process definition data 024 equals Date (simulation current time), the simulation processing module 012 determines that the predicated event (event that requires the order to start over) occurs at that time. Examples of "restart the order in the middle" or "restart the order from the beginning" include when work-in-process is completely damaged and needs to be redone and when the same type of product as that being processed is needed for another purpose and needs to be produced in a greater quantity.

Next, the simulation processing module 012 updates the process definition data 024 (S1107). The process definition data 024 is updated to reflect an increase in process work time caused by the event occurrence and a change in the earliest start time. Thus, the updating process in accordance with the type of the event is conducted only on the process definition data 024 corresponding to the process at which the simulation processing module 012 determines that the event occurs at Date (simulation current time). That is, if the type 301 of the event is "increase in process work time," the simulation processing module 012 increases the process work time. If the type 301 is "delay in process start time," the simulation processing module 012 delays the earliest start time 604. If the type 301 is "delay in order start time," the simulation processing module 012 delays the earliest start time 604 of the first process of the order. If the type 301 is "restart the order from the middle," the simulation processing module 012 creates the process definition data of a new order for each process, transfers the data of the original order including the order values to the new process definition data, and deletes the process sequence data subsequent to the completed process of the original order. If the type 301 is "restart the order from the beginning," the simulation processing module 012 creates the process definition data of a new order for each process, and transfers the data of the original order including the order values to the new process definition data.

Next, the simulation processing module 012 updates the schedule data 023 (S1108). The schedule data 023 is updated to reflect "delay in process start time," "delay in order start time," or "change in planned equipment" caused by the event occurrence. Thus, the updating process in accordance with the type of the event is conducted only on the schedule data 023 corresponding to the process at which the simulation processing module 012 determines that the event occurs at Date (simulation current time). That is, if the type 301 of the event is "delay in process start time," the simulation processing module 012 delays the planned start time 503. If the type 301 is "delay in order start time," the simulation processing module 012 delays the planned start time 503 of the first process of the order. If the type 301 is "restart the order from the middle," the simulation processing module 012 adds new schedule data 023 corresponding to the process definition data newly created in S1106.

That is, the simulation processing module 012 adds elements to the schedule data 023 such that the process work of the process sequence 1 is started immediately after the completion time of the current work and the respective subsequent processes are successively conducted, and then sets the scheduled start time for each addition element. If the type 301 is "restart the order from the beginning," the simulation processing module 012 adds elements to the schedule data 023 corresponding to the process definition data newly created in S1006. That is, the simulation processing module 012 adds elements to the schedule data 023 such that the process work of the process sequence 1 is started immediately after the completion time of the last process of the current order and the respective subsequent processes are successively conducted, and then sets the scheduled start time for each addition element.

After that, the simulation is conducted referring to the process definition data 024 updated in S1107 and the schedule data 023 updated in S1108. This way, the impact of the event occurrence is reflected in the simulation going forward.

Next, the simulation processing module 012 updates the planned rescheduling time (S1109).

The planned rescheduling time is the time when rescheduling is to be conducted after the schedule management system detects the fact that an event has occurred. The process to update the planned rescheduling time will be explained in detail with reference to the flowchart of FIG. 12.

Next, the simulation processing module 012 determines whether rescheduling is necessary or not (S1110), and if the rescheduling is necessary, the simulation processing module 012 performs the rescheduling (S1111). Rescheduling is to update the planned start time 503 and planned equipment 504 to proper values in the schedule data 023 of the unfinished processes at the time indicated by Date (simulation current time). That is, the simulation processing module 012 determines whether the Date (simulation current time) matches with the planned rescheduling time or not. If they match, the simulation processing module 012 determines that Date (simulation current time) is the timing at which the schedule management system detects the event occurrence, and updates the planned start time 503 and the planned equipment ID 504 to most appropriate values for all of the schedule data 023 for the processes that have not finished as of Date (simulation current time). The process to update the planned start time 503 and the planned equipment ID 504 to most appropriate values is conducted based on other schedule data 023 and process definition data 024, taking into consideration the presence or absence of planned equipment or replacement equipment, and switching of orders and processes. The simulation processing module 012 may use an existing scheduler (such as a scheduler used in a plant or the like for which the data analysis apparatus of this embodiment performs a simulation) to conduct the process to update the schedule.

Next, the simulation processing module 012 starts and completes the process (S1112). The process to start and complete a process is conducted to perform a simulation on the process from start to finish when Date (simulation current time) reaches the planned start time of the schedule data 023. Starting and completing a process will be explained in detail with reference to the flowchart of FIG. 13.

The simulation processing module 012 increments Date (simulation current time) (S1113), and repeats the processes after S1106. For example, as long as there is schedule data corresponding to Date (simulation current time), the simulation processing module 012 may repeatedly conduct S1106 to S1113.

The simulation processing module 012 also conducts the processes of S1102 to S1113 for each pattern of deploying the result-collecting system.

Figure 12:
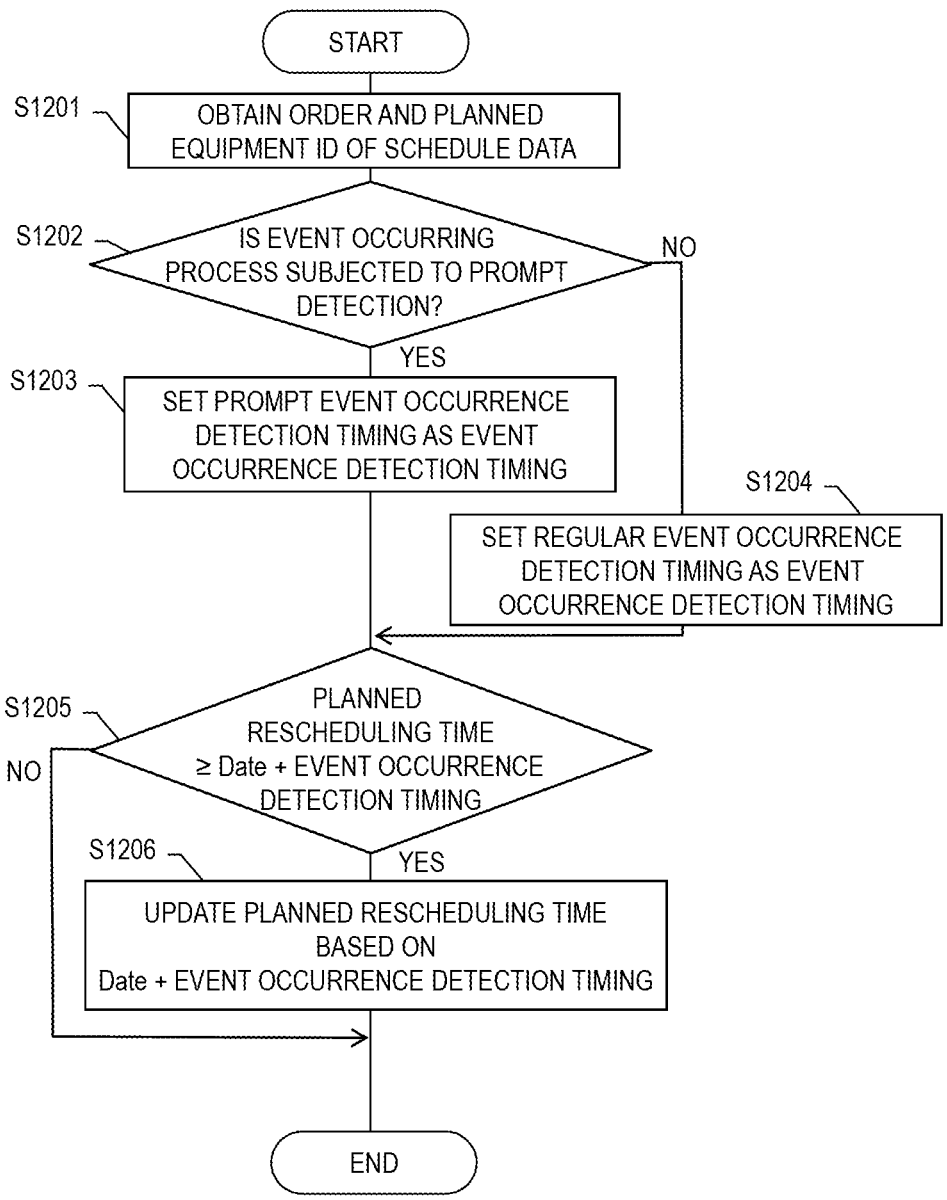
FIG. 12 is a flowchart showing in detail the process to update a planned rescheduling time conducted by the data analysis apparatus of an embodiment of the present invention.

FIG. 12 is a flowchart showing in detail the process to update the planned rescheduling time, which is conducted in S1108 by the data analysis apparatus of an embodiment of the present invention.

The planned rescheduling time is the time when the schedule management system detects an occurrence of an event and performs rescheduling based on the detection.

In this embodiment, for the timings to detect the occurrence of an event and perform the rescheduling, the regular event occurrence detection timing and prompt event occurrence detection timing are set in S904. Then, based on the regular event occurrence detection timing or the prompt event occurrence detection timing, the planned rescheduling time is updated. The regular event occurrence detection timing is used to estimate KPIs such as a lead time when the result-collecting system is not deployed. For example, if the schedule management system is to detect an event and perform the rescheduling accordingly 5 hours after the occurrence of the event, the time at 5 hours after the occurrence of the event, or in other words, the time obtained by adding 5 hours to Date (simulation current time), is the new planned rescheduling time. The planned rescheduling time is updated only when it is determined that an event will occur at Date (simulation current time) in S1105. If an event does not occur, it is not necessary for the simulation processing module 012 to perform the rescheduling, and therefore, the simulation processing module 012 conducts a simulation using the current schedule data 023.

In order to estimate the effect of partially deploying the result-collecting system, the simulation processing module 012 updates the planned rescheduling time using one of the regular event occurrence detection timing and the prompt event occurrence detection timing. For example, there are some cases where the result-collecting system is partially deployed in order to minimize the impact of the event occurrence while suppressing the investment for deploying the result-collecting system, such as deploying a result-collecting system only for new equipment, managing only an event that occurs in a process related to work-in-process for a customer with a large account using a tag or the like, or periodically reporting events that occur during a prescribed time window. In the case where such a result-collecting system is partially deployed, the schedule management system are configured to detect the occurrence of certain events and perform the rescheduling immediately, but occurrence of other types of events will not be detected right away, and the rescheduling is performed when those events are detected several hours later. By using the regular event occurrence detection timing and the prompt event occurrence detection timing, it is possible to perform a simulation appropriately even when the result-collecting system is partially deployed.

The flowchart of the updating process of the planned rescheduling time will be explained.

First, the simulation processing module 012 obtains the order 501 and the planned equipment ID 504 of the schedule data 023, which was found in the process to search for the applicable row, using the order and the process sequence of the event data (S1201).

Next, the simulation processing module 012 determines whether the event occurring in that particular process is to be detected promptly or not, referring to the prompt target data 029 (S1202). For example, the simulation processing module 012 may determine whether Date (simulation current time) meets the time condition 703 of the prompt target data 029 or not. This process is conducted when event occurrence is detected periodically for each time window by deploying and operating the batch collection system where it is difficult to deploy a real-time result-collecting system. Alternatively, the simulation processing module 012 may determine whether the planned equipment ID 504 is included in the equipment condition 702 in the prompt target data 029 or not. This process is conducted when the result-collecting system is deployed only for a part of equipment such as new equipment to avoid the cost to deploy the result-collecting system for all equipment. Alternatively, the simulation processing module 012 may determine whether the obtained order 501 is included in the order condition 701 in the prompt target data 029 or not. This process is conducted when events are promptly detected for work-in-process of certain types of customers only such as a customer with large account and a customer with a tight deadline.

Next, if the process at which an event occurs is subjected to the prompt detection (S1202: Yes), or in other words, the time condition, equipment condition, or order condition of the event meets the corresponding condition in the prompt target data 029, the simulation processing module 012 uses the prompt event occurrence detection timing as the event occurrence detection timing (S1203).

On the other hand, if the process at which an event occurs is not subjected to the prompt detection (S1202: No), the simulation processing module 012 uses the regular event occurrence detection timing as the event occurrence detection timing (S1204).

If the result-collecting system is deployed in all processes, the simulation processing module 012 uses only the prompt event occurrence detection timing as the event occurrence detection timing.

Next, the simulation processing module 012 determines whether the current value of the planned rescheduling time is ahead of the value obtained by adding the event occurrence detection timing to Date (simulation current time) or not (S1205). If the current value of the planned rescheduling time is ahead of the value obtained by adding the event occurrence detection timing to Date (simulation current time), the simulation processing module 012 updates the planned rescheduling time to a value that is the sum of Date (simulation current time) and the event occurrence detection timing. (S1206).

For example, in the simulation where two events are to happen, the first event is not subjected to the prompt detection, the planned rescheduling time thereof is "detect the event and perform the rescheduling accordingly at 3 pm," Date (simulation current time) is 2 pm, the second event is subjected to the prompt detection, and the value used for the rescheduling timing is 0 (immediately after the event occurrence), a new entry of "detect the event and perform the rescheduling accordingly at 2 pm" will be added. In this case, when the schedule management system detects the event and perform the rescheduling at 2 pm, the schedule management system takes into consideration the first event that has already occurred, and therefore, it is not necessary for the schedule management system to detect an event and perform the rescheduling again at 3 pm. Thus, the simulation processing module 012 changes the rescheduling plan to "detect an event and perform the rescheduling at 2 pm."

That is, if another event (second event) occurs before one event (first event) is detected, the rescheduling is performed when one of the two is detected first, and the rescheduling will not be performed when the other is detected. For example, if the second event is detected first, the rescheduling is performed at that point, and the rescheduling is not performed again when the first event is detected. This makes it possible to eliminate unnecessary rescheduling.

Figure 13:
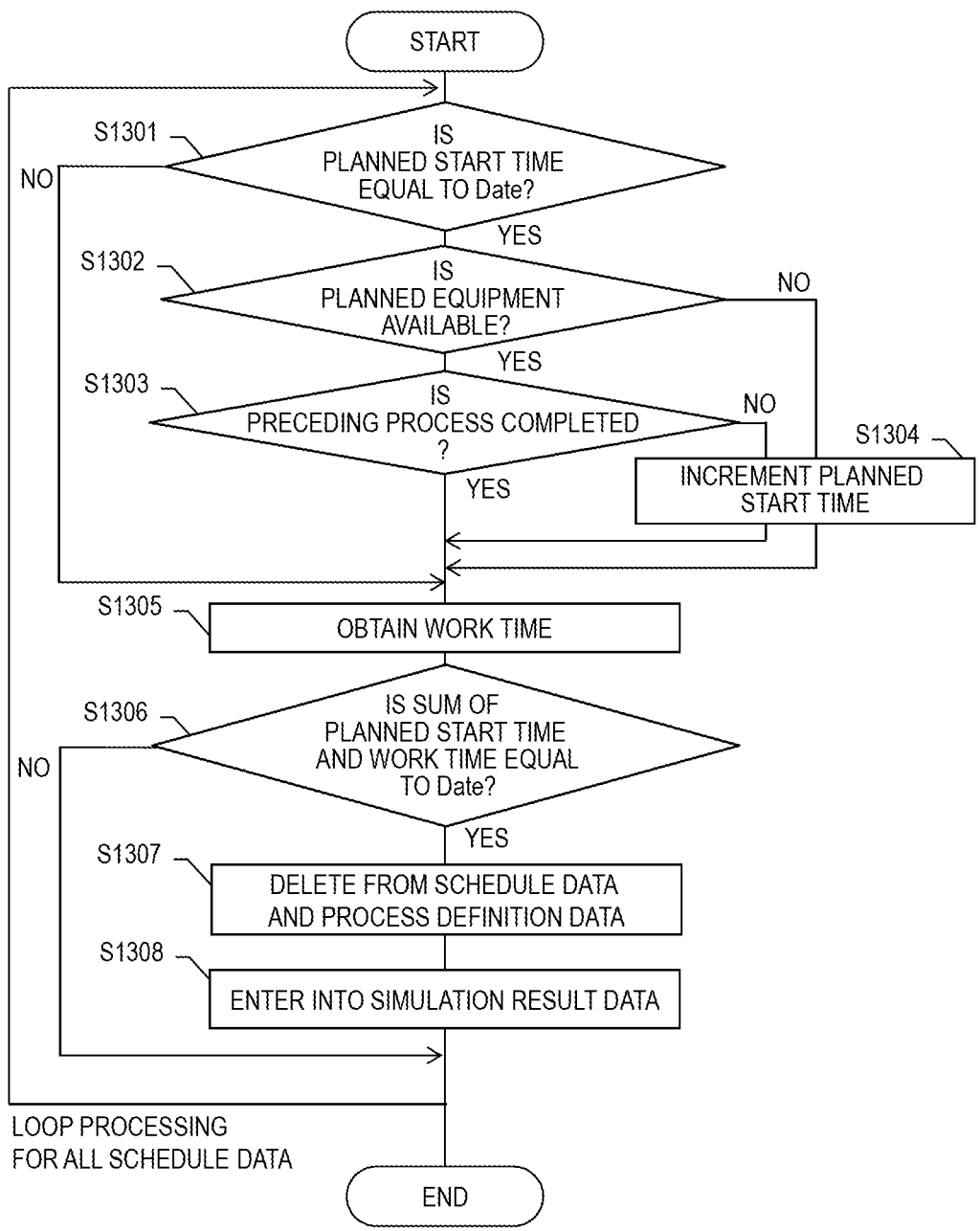
FIG. 13 is a flowchart showing in detail the process to start and complete process work conducted by the data analysis apparatus of an embodiment of the present invention.
Figure 15:
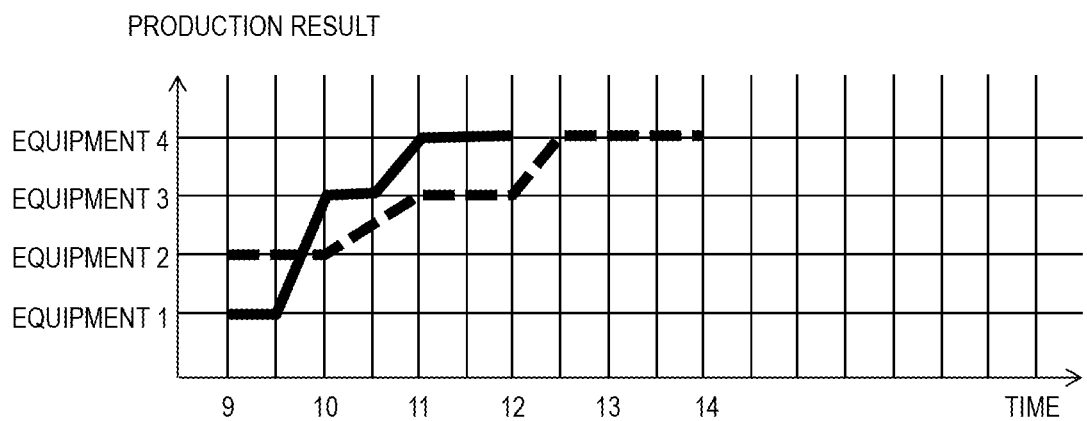
FIG. 15 is a diagram showing an example in which each process is conducted in accordance with the created schedule.
Figure 16:
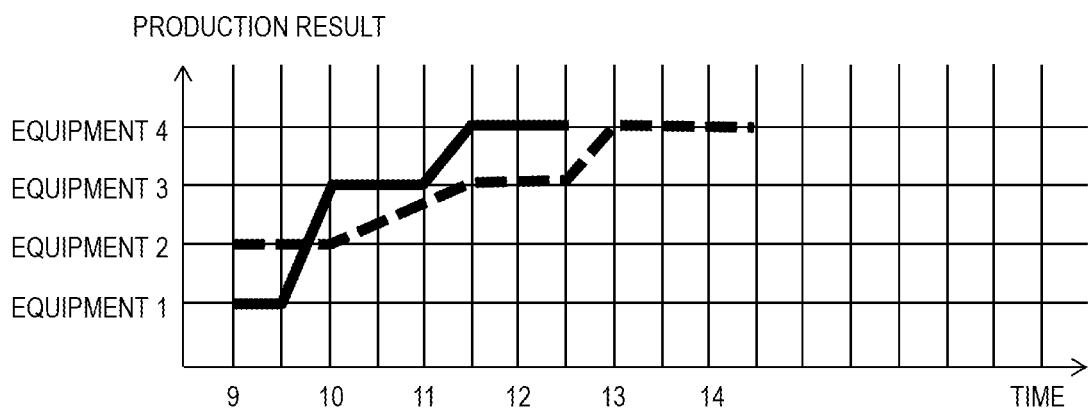
FIG. 16 is a diagram showing an example in which the process time is unexpectedly prolonged.
Figure 17:
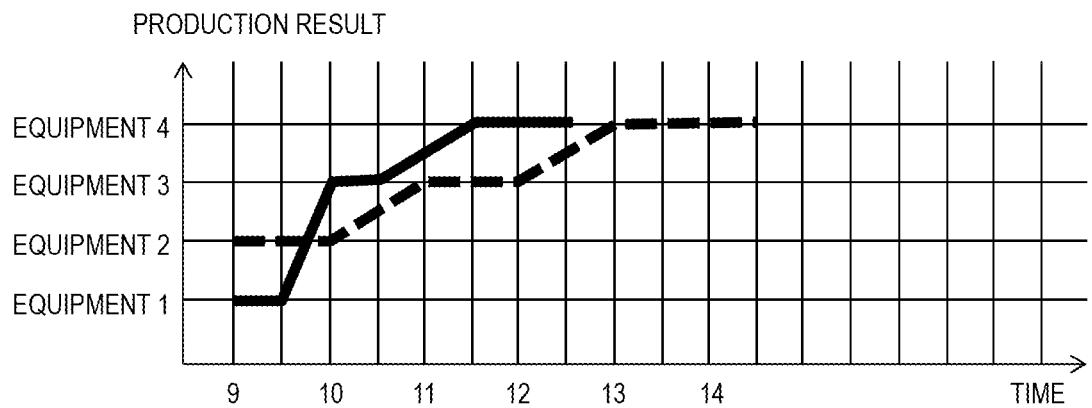
FIG. 17 is a diagram showing an example in which a fault of the production machine or an investigation on the location of work-in-process took place.
Figure 18:
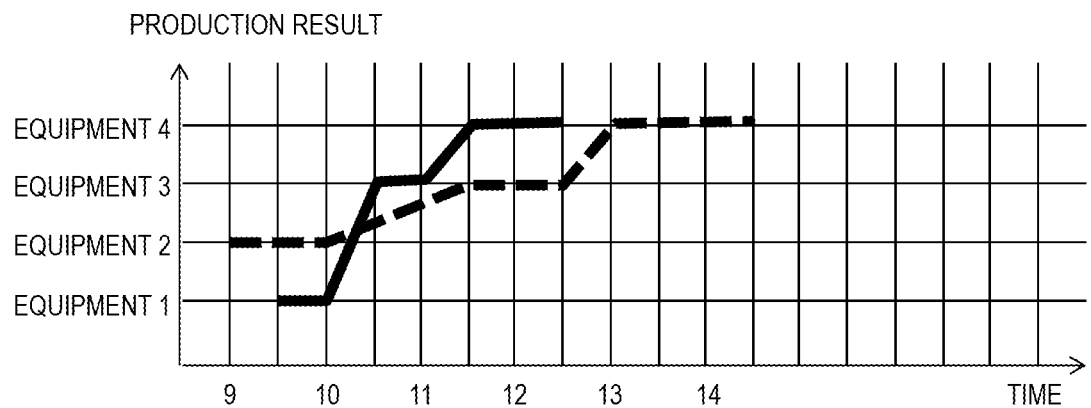
FIG. 18 is a diagram showing an example in which an arrival of purchased parts is delayed.

FIG. 13 is a flowchart showing in detail the process to start and complete process work, which is conducted in S1111 by the data analysis apparatus of an embodiment of the present invention.

The process to start and complete process work is conducted on all of the processes that include the process at which an event occurs, the processes that are affected by the event occurrence, and the processes that are not affected by the event occurrence. For the process at which an event occurs and the processes that are affected by the event occurrence, a simulation from the start to end of each process is conducted taking into account the effect of the event. A simulation is conducted before and after rescheduling. The simulation after rescheduling is conducted after the rescheduling is performed appropriately in S1110.

The flowchart of the process to start and complete process work will be explained.

For each unfinished schedule data 023, the simulation processing module 012 determines whether Date (simulation current time) has reached the planned start time 503 or not, or in other words, whether Date (simulation current time) is equal to the planned start time 503 (S1301). If Date (simulation current time) equals the planned start time 503, the simulation processing module 012 determines whether the planned equipment ID 504 is available or not (S1302). This determination is made based on whether the planned equipment is being used for the preceding process or not. Specifically, if the planned start time before Date (simulation current time) is not found in the schedule data 023 having the corresponding planned equipment ID 504, the simulation processing module 012 determines that the equipment is available. The availability of equipment can be determined in this method because the schedule data of the finished process is deleted as described in S1307 below. If the planned equipment 504 is available, the simulation processing module 012 determines whether the preceding process in that order is completed or not. Specifically, if the schedule data 023 having the same order and the preceding process sequence is not found, the simulation processing module 012 determines that the preceding process is completed.

Next, if Date (simulation current time) has reached the planned start time 503 (S1301), the planned equipment is available (S1302), and the preceding process is completed (S1303), the simulation processing module 012 obtains the work time 603 based on the corresponding order 601 and the process sequence 602 in the process definition data 024 (S1305).

If the planned equipment is not available (S1302), or if the preceding process is not completed yet (S1303), the process cannot be started, and enters a stand-by state until the preceding process is completed. That is, the simulation processing module 012 increments the planned start time 503 of the schedule data 023 for the process (S1304). The planned start time 503 is incremented by adding a prescribed period of time (30 minutes for example) to the current planned start time 503.

Next, the simulation processing module 012 determines whether the sum of the planned start time and work time is equal to Date (simulation current time) or not (S1306). If the sum of the planned start time and work time is equal to Date (simulation current time), this means that the process is completed as of Date (simulation current time).

If the process is completed, the simulation processing module 012 deletes data related to the corresponding process from the schedule data 023 and the process definition data 024 (S1307).

After deleting data, the simulation processing module 012 enters necessary information into the simulation result data 026 (S1308). The simulation result data is used to calculate KPIs such as the lead time. Specifically, the simulation result data 026 has items similar to the production result data 025 that has the order 801, process sequence 802, equipment ID 804, start time 805, and completion time 806, and in the respective items, the order to which the process completed in the simulation belongs, the process sequence thereof, the equipment used for the process, and start time and completion time of the process in the simulation are registered.

Next, the process conducted in S907 of FIG. 9 will be explained in detail.

The display processing module 013 calculates the lead time based on all of the simulation result data 026. Similarly, the display processing module 013 calculates the inventory using the gross average method based on all of the simulation result data 026. The display processing module 013 also calculates the on-time delivery rate based on all of the simulation result data 026. Those are the examples of KPI, and other KPIs may also be calculated. The calculation of those KPIs may be performed by any methods including known methods, and therefore, the detailed explanation will be omitted. The display processing module 013 summarizes those calculation results for each of the result-collecting system deployment patterns (condition of the prompt target data).

FIG. 14 is a diagram explaining information output by the data analysis apparatus of an embodiment of the present invention.

For example, the display processing module 013 displays the KPIs in a table format for each of the result-collecting system deployment patterns (S907). In the example of FIG. 14, the probability of the respective types of events used for the simulation conditions, KPIs for the case in which the rescheduling is performed immediately after the event occurs, and KPIs for the case in which an event is not detected immediately after occurrence (such as detecting the event and the rescheduling 5 hours after the occurrence of the event) are displayed. In this example, the lead time, inventory, and on-time delivery rate are displayed as KPIs. This way, it is possible to present the cost performance of the real-time result-collecting system. It is also possible to present the cost performance of the partial deployment of the result-collecting system.

In this specification, KPIs are displayed in the table format, but it is also possible to display the rescheduling timings using a line graph with the probability of events gradually increasing.

According to an embodiment of the present invention, by conducting a simulation, the effect of introducing the system to collect actual results can be estimated quantitatively. The effect of partially deploying the result-collecting system can also be estimated. This makes it possible to select a section to deploy the result-collecting system for the maximum cost performance.

The present invention is not limited to the embodiment described above, and may include various modification examples. For example, the embodiment above was explained in detail so that the present invention is understood more easily but the present invention does not necessarily have to have all of the configurations described above.

A part of all of the respective configurations, functions, processing parts, processing means and the like may be realized by hardware by means of an integrated circuit, for example. The respective configurations, functions, and the like may also be realized by software by having the processor to interpret and execute the various programs realizing those functions. Information for realizing the respective functions such as programs, tables, and files can be stored in a memory device such as a non-volatile semiconductor memory, hard disk drive, or SSD (solid state drive), or a computer readable non-temporary data storage medium such an IC card, SD card, or DVD.

The control lines and information lines in the descriptions above are merely the ones necessary to explain the present invention, and all of the control lines and the information lines in a product are not necessarily shown. In the actual apparatus, almost all of the configurations are connected to each other.

What is claimed is:

1. A data analysis apparatus, comprising:
an event occurrence setting module configured to cause a prescribed event to occur in a simulation for a work order that includes a process at which the prescribed event is to occur;
an event occurrence detection timing setting module configured to store, in a storage module, an event occurrence detection timing indicating a time period between an occurrence of an event and detection of the event;
a simulation executing processing module configured to execute a simulation when an occurrence of the event is detected, the simulation executing processing module being configured to execute a simulation that reflects an effect on the process when the event is addressed in accordance with the event occurrence detection timing recorded in the storage module, wherein if the process is affected by the occurrence of the event, the simulation takes into consideration a delay in process work time by the occurrence of the event, and wherein if the process is not affected by the occurrence of the event, the simulation is conducted based on a start time of the process and work time of an original schedule; and a KPI calculating module configured to calculate a KPI of the process for the event occurrence detection timing, based on results of the simulation executed by the simulation executing processing module.

2. The data analysis apparatus according to claim 1,
wherein the event occurrence detection timing setting module sets a plurality of event occurrence detection timings, and
wherein the simulation executing processing module is configured to:
identify, when the event occurs, one of the plurality of event occurrence detection timings to be applied to a simulation that reflects the effect of the event;
calculate a rescheduling timing based on the identified event occurrence detection timing, the rescheduling timing indicating a timing for executing a simulation that reflects the effect; and
execute, when a plurality of events occur and a first rescheduling timing of a first event comes after a second rescheduling timing of a second event that occurs after the first event, a simulation that reflects the effect at the timing identified by the second rescheduling timing.

3. The data analysis apparatus according to claim 2,
wherein the simulation executing processing module is configured to:
record, when the first event is detected, the first rescheduling timing as an estimated rescheduling timing at which a simulation that reflects the effect is executed, and
overwrite, when the second event is detected and the second rescheduling timing comes after the estimated rescheduling timing, the estimated rescheduling timing with the second rescheduling timing.

4. The data analysis apparatus according to claim 3,
wherein the plurality of event occurrence detection timings include a regular event occurrence detection timing and a prompt event occurrence detection timing having a shorter time period than the regular event occurrence detection timing, and
wherein the simulation executing processing module is configured to:
determine whether an event that occurs in the process meets requirements of prompt event data that is set in advance, and
define the prompt event occurrence detection timing as the event occurrence detection timing if the requirements of the prompt event data are met, and define the regular event occurrence detection timing as the event occurrence detection timing if the requirements of the prompt event data are not met.

5. A data analysis method, comprising:
an event occurrence setting step to cause an prescribed event to occur in a simulation for a work order that includes a process at which the prescribed event is to occur;

an event occurrence detection timing setting step to store, in a storage module, an event occurrence detection timing indicating a time period between an occurrence of an event and detection of the event;
a simulation executing processing step to execute a simulation when an occurrence of the event is detected, the simulation executing processing step being configured to execute a simulation that reflects an effect on the process when the event is addressed in accordance with the event occurrence detection timing recorded in the storage module, wherein if the process is affected by the occurrence of the event, the simulation takes into consideration a delay in process work time by the occurrence of the event, and wherein if the process is not affected by the occurrence of the event, the simulation is conducted based on a start time of the process and work time of an original schedule; and
a KPI calculating step to calculate a KPI of the process for the event occurrence detection timing based on results of the simulation executed in the simulation executing processing step.

6. The data analysis method according to claim 5,
wherein, in the event occurrence detection timing step, a plurality of event occurrence detection timings are set, and
wherein, in the simulation executing processing step,
one of the plurality of event occurrence detection timings is identified when the event occurs, and is applied to a simulation that reflects the effect of the event,
a rescheduling timing is calculated based on the identified event occurrence detection timing, the rescheduling timing indicating a timing for executing a simulation that reflects the effect, and
when a plurality of events occur and a first rescheduling timing of a first event comes after a second rescheduling timing of a second event that occurs after the first event, a simulation that reflects the effect is executed at the timing identified by the second rescheduling timing.

7. The data analysis method according to claim 6,
wherein, in the simulation executing processing step, when the first event is detected, the first rescheduling timing is recorded as an estimated rescheduling timing at which a simulation that reflects the effect is executed, and when the second event is detected and the second rescheduling timing comes after the estimated rescheduling timing, the estimated rescheduling timing is overwritten with the second rescheduling timing.

8. The data analysis method according to claim 7,
wherein the plurality of event occurrence detection timings include a regular event occurrence detection timing and a prompt event occurrence detection timing having a shorter time period than the regular event occurrence detection timing, and
wherein, in the simulation executing processing step, whether an event that occurs in the process meets requirements of prompt event data or not is determined, the prompt event data being set in advance, and if the requirements of the prompt event data are met, the prompt event occurrence detection timing is defined as the event occurrence detection timing, and if the requirements of the prompt event data are not met, the regular event occurrence detection timing is defined as the event occurrence detection timing.

* * * * *